US008379703B2

(12) United States Patent
Nara

(10) Patent No.: US 8,379,703 B2
(45) Date of Patent: Feb. 19, 2013

(54) SIGNAL ANALYZER AND METHOD FOR DISPLAYING FREQUENCY DOMAIN DATA

(75) Inventor: Akira Nara, Tokyo (JP)

(73) Assignee: Tektronix, Inc., Beaverton, OR (US)

( * ) Notice: Subject to any disclaimer, the term of this patent is extended or adjusted under 35 U.S.C. 154(b) by 109 days.

(21) Appl. No.: 12/434,536

(22) Filed: May 1, 2009

(65) Prior Publication Data

US 2010/0272166 A1      Oct. 28, 2010

(30) Foreign Application Priority Data

May 2, 2008    (JP) ................................. 2008-120748

(51) Int. Cl.
H04B 3/46        (2006.01)
(52) U.S. Cl. ...................................................... 375/224
(58) Field of Classification Search .................... 375/224
See application file for complete search history.

(56) References Cited

U.S. PATENT DOCUMENTS

2005/0251388 A1*  11/2005  Lang et al. ..................... 704/226
2006/0062363 A1*  3/2006   Albrett ...................... 379/101.01
2006/0291631 A1*  12/2006  Hosoi et al. ................ 379/88.07

FOREIGN PATENT DOCUMENTS

WO        2006/096760 A      9/2006

OTHER PUBLICATIONS

Kazuyoshi Yoshii et al: "Drum Sound Recognition for Polyphonic Audio Signals by Adaptation and Matching of Spectrogram Templates with Harmonic Structure Suppression" IEEE Transactions on Audio, Speech, and Language Processing, IEEE Service Center, New York, NY, US, vol. 15, No. 1, Jan. 2, 2007, pp. 333-345, XP011151939 ISSN: 1558-7916.
Schmalkoke, Peter: "Multidimensional EM field analysis and representation"[Online] May 1, 2001, pp. 1-6, XP002388288 Retrieved from the Internet: URL: http://www.vlf.it/dfatvlf/rdfatvlf.htm> [retrieved on Jul. 3, 2007] Chapter "Representation of multiple dimensions", paragraph 2.
Wan-Thai Hsu et al: "Stiffness-compensated temperature-insensitive micromechanical resonators" Preceedings of the IEEE 15th. Annual International Conference on Microelectro Mechanical Systems. MEMS 2002. Los Vegas, NV, Jan. 20-24, 2002, IEEE International Micro Electro Mechanical Systems Conference, New York, NY : IEEE, US, vol. Conf. 15, 2002, pp. 731-734, XP010577758 ISBN: 0-7803-7185-2.
Database ADS [Online] Nasa; Moscow, Izdatel'stvo Sovetskoe Radio, p. 272 1979, Levin, V.A.; Norkin, G. A.:"Radio engineering filter systems with reverse heterodyning" XP002311540 retrieved from HTTP://ADSABS.HARVARD.EDU/ABS/1979MIZSR...Q... L.

* cited by examiner

Primary Examiner — David C. Payne
Assistant Examiner — Brian J Stevens
(74) Attorney, Agent, or Firm — Michael A. Nelson

(57) ABSTRACT

A signal analyzer provides frequency domain data at different time and frequency resolution. First type frequency domain data is derived from time domain data of a signal under test by first type frames and displayed as a spectrogram. A selecting box is displayed on the spectrogram for selecting the first type frames. The signal analyzer produces second type frequency domain data by treating the time domain data corresponding to the first type frequency domain data included in the selected first type frames with the selecting box as one frame by FFT calculation. The resultant second type frequency domain data are displayed as a spectrum that has different time and frequency resolution from the spectrogram.

3 Claims, 4 Drawing Sheets

SIGNAL ANALYZER AND METHOD FOR DISPLAYING FREQUENCY DOMAIN DATA

TECHNICAL FIELD

Embodiments of the present invention related to signal analysis and more particularly to displaying frequency domain data.

BACKGROUND

Various systems, such as a wireless communication system including mobile phones, are sometimes required to test whether they work properly. A signal analyzer may be used for measuring signals of the system under test. The signal analyzer can analyze a signal from viewpoints of both time and frequency domains. It converts the signal under test into digital data of the time domain and generates digital data of the frequency domain from the time domain data by FFT (Fast Fourier Transform) calculation. The resultant data are displayed as a waveform and/or numeric values on the display of the signal analyzer. The signal analyzer shows the time domain data corresponding to the frequency domain data of the signal under test, which makes it possible to provide various analyses from viewpoints of both the time and frequency domains. U.S. Pat. No. 6,377,617 discloses how to produce the frequency domain data with keeping correspondence relationship with the time domain data.

FIG. 3 is a conventional view of the frequency domain data on the signal analyzer 10. A graph area 40 displays the frequency domain data as a spectrum graph of which horizontal axis is frequency and vertical axis is power (dBm). A graph area 42 displays the frequency domain data as a spectrogram graph of which horizontal axis is frequency, vertical axis is time in frame number and level of the power is shown in color. A new frame is displayed in order from the bottom. The colors may be subject to the order of rainbow colors wherein if the power is higher the color is closer to red and the power is lower the color is closer to violet.

A square marker 46 on the graph 42 is used for designating a desired frame 48 by dragging the marker with a mouse cursor 44 by the user. The frequency domain data of the frame 48 designated by the center point of the marker 46 is displayed as a spectrum on the graph area 40.

SUMMARY

If a higher frequency resolution of the frequency domain data is necessary, then the time length of the frame should be longer. If the time length of the frame becomes longer while the frequency span is fixed, then the amount of the time domain data in the frame increases. However, if the time length of the frame becomes longer, then the time resolution becomes lower.

Referring to FIG. 3, the spectrum in the graph area 40 and the spectrogram in the graph area 42 use the frame of the same time length so that if the time length of the frame becomes longer, both the graphs have higher frequency resolution but lower time resolution. It is not preferable for a user who wants to observe the signal under test from various aspects at different time and frequency resolution.

What is desired is to provide the frequency domain data from various aspects at different time and frequency resolution.

Embodiments of the present invention relate to an apparatus for producing frequency domain data at different time and frequency resolution. First display means displays first type frequency domain data derived from the time domain data of a signal under test every first type frame as a spectrogram. Selecting means are provided for selecting the first type frames on the spectrogram. It may be realized as a selecting box displayed on the spectrogram or as a means for designating a time range for selecting the first type frames. The time domain data of the selected first type frames are deemed as a new frame from which second type frequency domain data is produced.

The produced second type frequency domain data may be displayed with second display means as a spectrum separately from the spectrogram of the first type frequency domain data. The second display means may be a different display area from the first display means on the same screen.

It may further have means for inputting the number of the time domain data used as one frame of the second type frequency domain data for changing the number of the first type frames selected by the selecting means depending on the input data number. It may further have means for designating a resolution bandwidth (RBW) or noise bandwidth (NBW) and means for calculating the number of the time domain data used as one frame of the second type frequency domain data depending on the designated RBW or NBW for changing the number of the first type frames selected with the selecting means depending on the calculated data number.

Embodiments of the present invention comprise methods for displaying frequency domain data. First type frequency domain data is produced from time domain data of a signal under test every first type frame and displayed as a spectrogram. Selecting means is displayed on the spectrogram for selecting the first type frames in the spectrogram. The time domain data of the selected first type frames is deemed to be a new frame from which second type frequency domain data is produced. Finally, the second type frequency domain data is displayed as a spectrum wherein the displayed spectrogram and spectrum have different time and frequency resolution each other.

The objects, advantages and other novel features of the present invention are apparent from the following detailed description when read in conjunction with the appended claims and attached drawings.

DETAILED DESCRIPTION

An embodiment of the present invention is described below as it works on the hardware shown in FIG. 1, for example.

Figure 1:
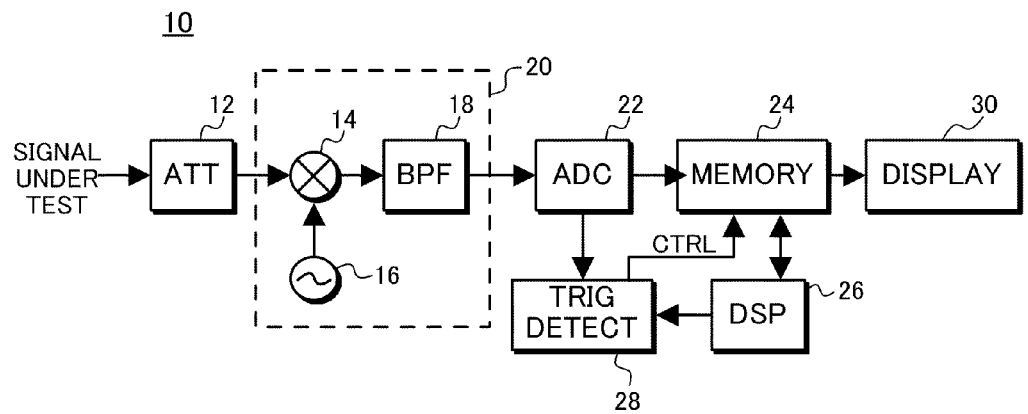
FIG. 1 is a block diagram of a signal analyzer.

FIG. 1 is a block diagram of a signal analyzer 10. In addition to the dedicated hardware obtaining, and digitizing the signal, the signal analyzer 10 may have capabilities and hardware similar to a personal computer (PC) and adopt a generally used CPU and operating system so that it provides a PC-like user interface through a mouse, a keyboard on the operation panel, etc. for various settings, and stores a large amount of data and program in a hard disk drive (HDD) though they are not shown. The CPU may be used to control the system shown in FIG. 1, including the DSP. Individual components, such as the DSP, may need to be modified to support embodiments of the present invention.

An input attenuator 12 properly adjusts the level of a signal under test and the adjusted signal is provided to an analog down-converter 20. The down-converter 20 has mixer 14, local oscillator 16 and bandpass filter (BPF) 18 for analog-down-conversion of the frequency of the input signal to produce an intermediate frequency (IF) signal. An analog to digital converter (ADC) 22 converts the analog IF signal into digital data (time domain data). A memory 24 stores the digital data of the IF signal. A digital signal processor (DSP) 26 reads the IF signal data from the memory 24, digitally down-converts the read data and produces frequency domain data by fast Fourier transform (FFT) calculation. The frequency domain data are stored in the memory 24 and displayed as a waveform and/or numeric values. The DSP 26 may conduct various other calculations according to the program stored in the HDD.

A trigger detection circuit 28 receives the time domain data from the ADC 22 and the frequency domain data from the DSP 26 to detect data satisfying a user-defined trigger condition for retaining desired time domain data and/or frequency domain data in the memory 24. Alternatively, the trigger condition may not be set and such setting may be available as the time domain data and/or frequency domain data may be temporarily stored in the memory 24 and transferred to the HDD as far as the HDD can store the data.

A user may set a center frequency and a frequency span to the signal analyzer according to a desired frequency band in the signal under test. In general, an available width of the frequency span is a half or less of the sampling frequency of the ADC because of the Nyquist condition.

Figure 2:
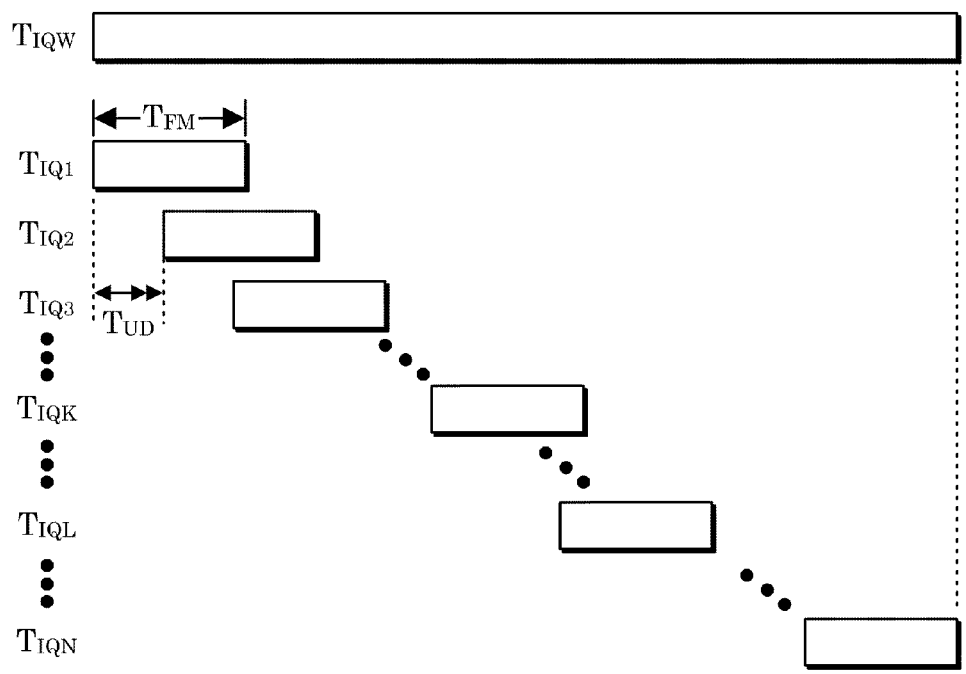
FIG. 2 shows a relationship between time domain data and frames.

The FFT calculation produces the frequency domain data every frame wherein each frame has a predetermined amount of the time domain data. FIG. 2 shows the relationship between the time domain data and the frames. TIQW is all of the acquired time domain data of the signal under test that includes I and Q data. TFM is the length of the frame and TUD is an update time of the frame. One frame of the frequency domain data is derived from the one frame of the time domain data. The number of the time domain data in each frame may be 2n (n is an integer) or typically 1,024 points for example.

Figure 3:
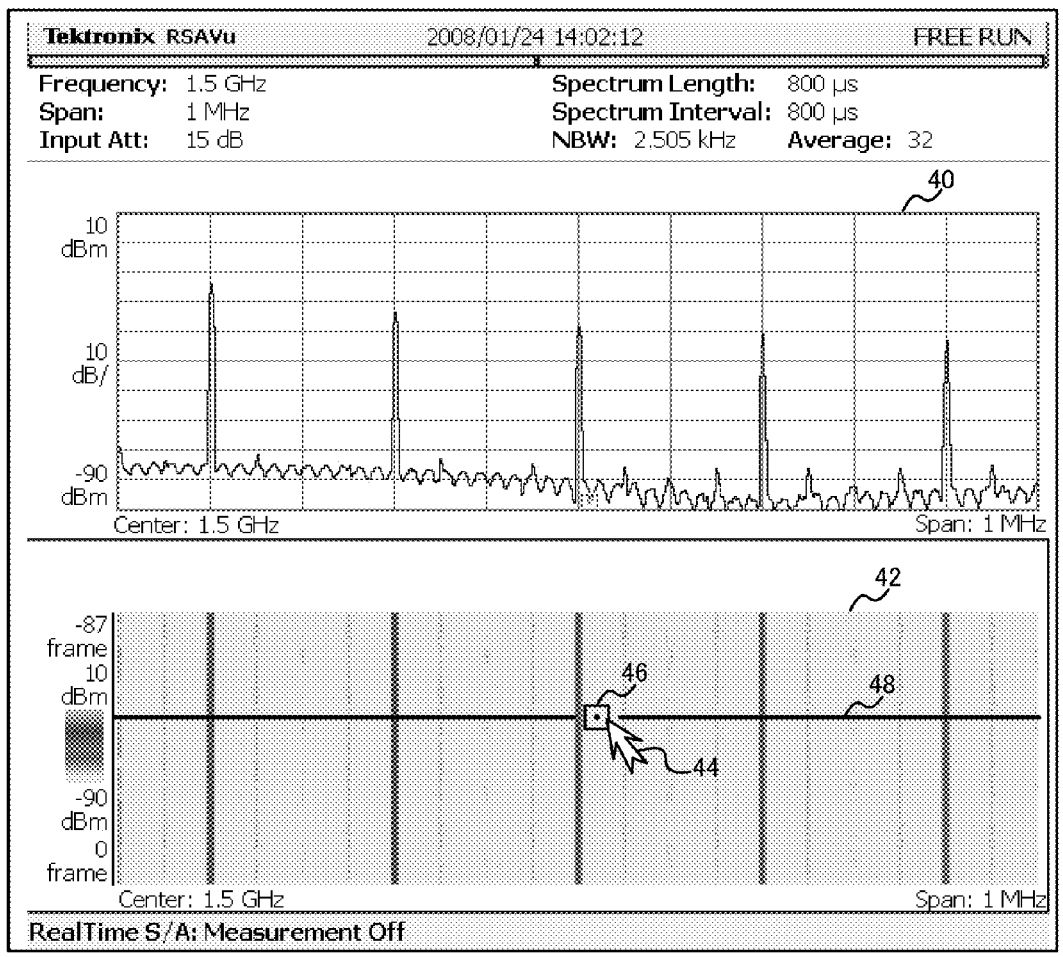
FIG. 3 is a display example of frequency domain data on the display screen of a signal analyzer.
Figure 4:
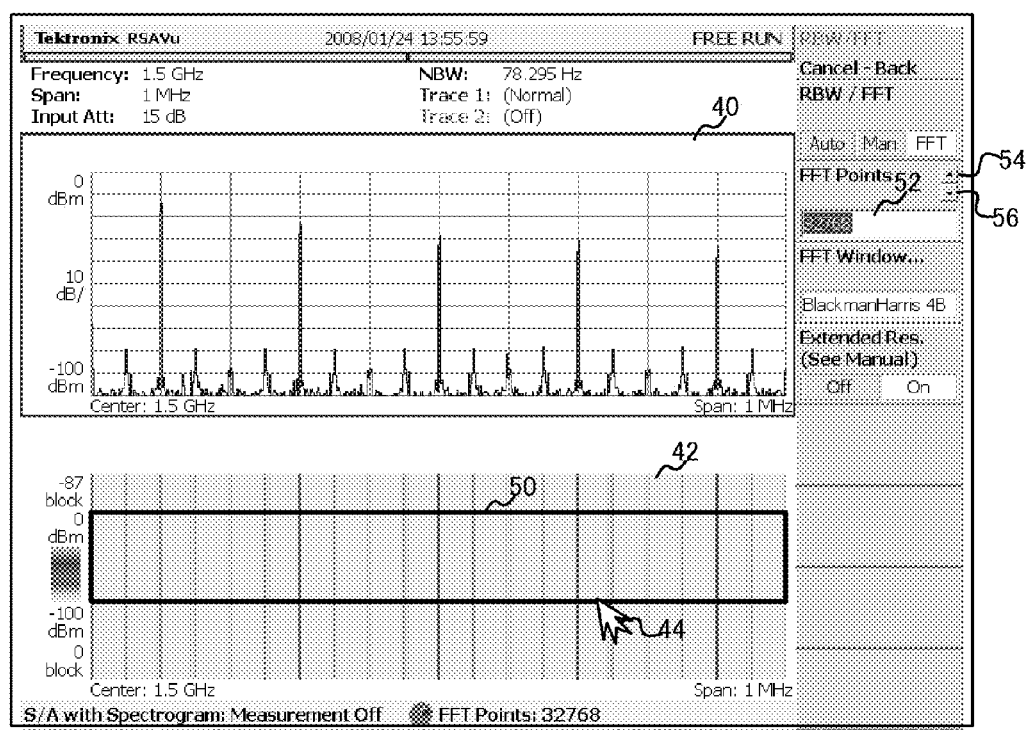
FIG. 4 is a display example of the display screen of a signal analyzer to which the presenting invention is applied.

FIG. 4 is a display example on the screen of the signal analyzer 10 when the present invention is applied to the signal analyzer 10. In the following description, blocks corresponding to those in FIG. 3 are indicated by the same reference numbers. A difference between the display screen of the signal analyzer 10 as shown in FIG. 4 compared to the display screen shown in FIG. 3 is that the display screen shown in FIG. 4 displays a selecting box 50 on the spectrogram in the graph area 42.

The CPU (not shown) of the signal analyzer 10 identifies the time domain data used for producing the frequency domain data (hereinafter, called first type frequency domain data) that are included in the frames (hereinafter, called first type frames) selected with the selecting box 50. The CPU deems the identified time domain data as a new frame (hereinafter, called a second type frame) to produce new frequency domain data (called second type frequency domain data) by FFT calculation using, if necessary, the DSP 26. The new second type frequency domain data is displayed as a spectrum in the graph area 40.

The spectrum displayed in the graph area 40 of FIG. 4 has higher frequency resolution and lower time resolution than the corresponding spectrum of FIG. 3. However, the time and frequency resolution of the spectrogram displayed in the graph area 42 of FIG. 4 are the same as those of FIG. 3. That is, the graph areas 40 and 42 of FIG. 4 display two sets of the frequency domain data, each set having a respective different time and frequency resolution. This is a significant difference from the case of FIG. 3.

The selecting box 50 clearly indicates which first type frames are selected on the spectrogram in terms of time so that the time relationship between the spectrum in the graph area 40 and the spectrogram in the graph area 42 is also clear.

A user may change the width of the selecting box 50 along the time axis with the mouse cursor 44 by a graphical operation. This operation makes the frequency resolution of the spectrum displayed in the graph area 40 change. The user can easily get to the most suitable frequency resolution while watching the displayed spectrum.

A field 52 displays the data amount (number of FFT points) of the time domain data used for producing the second type frequency domain data as a result of being included in the first type frames selected with the selecting box 50.

Conversely, if the FFT point number is modified by clicking an arrow button 54 or 56 with the mouse cursor 44, the width of the selecting box 50 along the time axis is automatically changed. If each of the first type frames has 1024 points, the time domain data number of the second type frame may be 1024 multiplied by $2^K$ (K is an integer) for convenience of the FFT calculation. Then, the number in the field 52 may change like 2, 4, 8, . . . times of 1024 by clicking the arrow button 54 or 56.

FIG. 4 shows an example of 32768 (=1024×$2^5$) points as the number in the field 52. That is, the FFT calculation is conducted by deeming the time domain data of 32,768 points as one second type frame.

Figure 5:
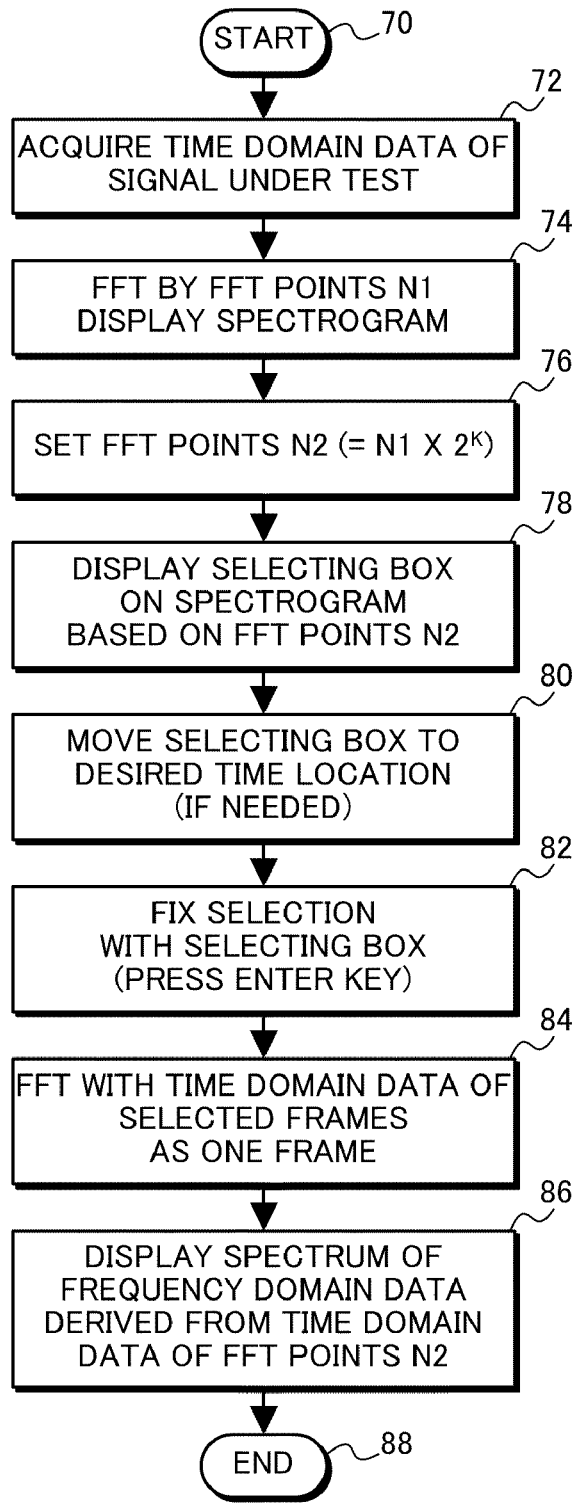
FIG. 5 is an example of a flowchart for frequency domain data display according to the present invention.

Alternatively, the frequency resolution of the spectrum displayed in the graph area 40 may be changed by designating noise bandwidth (NBW) or Resolution Bandwidth (RBW). If one of them is designated, the CPU of the signal analyzer 10 calculates the necessary data amount of the time domain data and treats the calculated data amount as one frame (second type frame) to produce the second type frequency domain data by FFT calculation FIG. 5 is an example of a flowchart for displaying the frequency domain data according to the present invention. The signal analyzer 10 acquires the time domain data of a signal under test as is well known (step 72) and conducts the FFT calculation frame by frame wherein each first type frame has the FFT points of the number N1, and the resultant first type frequency domain data are displayed as a spectrum in the graph area 40 and a spectrogram in the graph area 42 (step 74) as shown in FIG. 3.

The user sets another FFT point number, N2, that may be $2^K$ times of N1 in the field 52 (step 76). The FFT point number N2 becomes the data number of the time domain data used as one frame of a new second type frequency domain data. The signal analyzer 10 calculates the width of the selecting box 50 along the time axis displayed on the spectrogram in the graph area 42 depending on the FFT point number N2 to display the selecting box 50 (step 78). Alternatively, the selecting box may be displayed in advance as described based on predetermined settings and the width along the time axis is changed with the mouse cursor 44 to change the FFT point number N2.

The user may move the selecting box 50 to a desired time location by dragging it with the mouse cursor 44 if necessary (step 80). In the initial settings, the time location selected with the marker 46 on the display screen of FIG. 3 may be set as the center of the width along the time axis of the selecting box 50, for example.

When the user determines the first type frames selected with the selecting box 50 by pressing an Enter key, etc., on the operation panel of the signal analyzer 10 (step 82), the signal analyzer 10 conducts the FFT calculation with the time domain data of the selected first frames as one frame, or second type frame (step 84). Finally, the frequency domain data derived from the time domain data of the FFT point number N2 are displayed as a spectrum in the graph area 40.

In the embodiments described herein, an FFT is indicated as being used to transform time domain data into frequency domain data. Those of ordinary skill in the art will understand that other methods of transforming time domain data into frequency domain data are similarly applicable including other forms of discrete Fourier Transforms and Chirp-Z transforms for example.

Although the invention has been disclosed in terms of the preferred and alternative embodiments disclosed herein, those skilled in the art will appreciate that modifications and improvements may be made without departing from the scope of the invention. For example, another user interface may be provided in place of the described selecting box to designate a time range for selecting the first type frames.

What is claimed is:

1. A signal analyzer comprising:
   means for processing time domain data of a signal under test to generate display data for a spectrogram of a plurality of first type frames of first type frequency domain data, wherein the processing means is operable to extract the time domain data corresponding to two or more of the first type frames as a single second type frame;
   means for selecting two or more of the first type frames of the spectrogram as the single second type frame;
   means for calculating second type frequency domain data using the time domain data corresponding to the second type frame; and
   means for displaying the spectrogram and the second type frequency domain data as a spectrum simultaneously wherein the displayed spectrogram and spectrum have different time and frequency resolution each other;
   wherein said selecting means comprises:
   means for designating a noise bandwidth or a resolution bandwidth; and
   means for calculating the time domain data amount corresponding to the second type frame depending on the designated noise bandwidth or resolution bandwidth.

2. A method for displaying frequency domain data comprising steps of:
   displaying first type frequency domain data derived from time domain data of a signal under test by first type frames as a spectrogram;
   displaying selecting means for selecting two or more of the first type frames in the spectrogram;
   producing second type frequency domain data of which one frame is derived from the time domain data corresponding to the selected first type frames;
   displaying the spectrogram and the second type frequency domain data as a spectrum simultaneously wherein the displayed spectrogram and spectrum have different time and frequency resolution each other;
   designating a noise bandwidth or resolution bandwidth; and
   calculating the data number of the time domain data used as one frame of the second type frequency domain data depending on the designated noise bandwidth or resolution bandwidth wherein the number of the first type frames selected with the selecting means is changed depending on the data number.

3. A signal analyzer comprising:
   first displaying means for displaying first type frequency domain data derived from time domain data of a signal under test by first type frames as a spectrogram;
   means for selecting two or more of the first type frames in the spectrogram;
   means for producing second type frequency domain data of which one frame is derived from the time domain data corresponding to the selected first type frames;
   means for displaying the spectrogram and the second type frequency domain data as a spectrum simultaneously wherein the displayed spectrogram and spectrum have different time and frequency resolution each other;
   means for designating a noise bandwidth or resolution bandwidth; and
   means for calculating the data number of the time domain data used as one frame of the second type frequency domain data depending on the designated noise bandwidth or resolution bandwidth wherein the number of the first type frames selected with the selecting means is changed depending on the data number.

* * * * *